(12) United States Patent
Lee

(10) Patent No.: US 8,691,669 B2
(45) Date of Patent: Apr. 8, 2014

(54) VAPOR DEPOSITION REACTOR FOR FORMING THIN FILM

(71) Applicant: Veeco ALD Inc., Fremont, CA (US)

(72) Inventor: Sang In Lee, Sunnyvale, CA (US)

(73) Assignee: Veeco ALD Inc., Fremont, CA (US)

( * ) Notice: Subject to any disclaimer, the term of this patent is extended or adjusted under 35 U.S.C. 154(b) by 0 days.

(21) Appl. No.: 13/904,790

(22) Filed: May 29, 2013

(65) Prior Publication Data

US 2013/0260539 A1  Oct. 3, 2013

Related U.S. Application Data

(62) Division of application No. 12/539,477, filed on Aug. 11, 2009, now Pat. No. 8,470,718.

(60) Provisional application No. 61/088,674, filed on Aug. 13, 2008.

(51) Int. Cl.
*H01L 21/20* (2006.01)

(52) U.S. Cl.
USPC ............ 438/478; 438/483; 438/761; 438/767

(58) Field of Classification Search
USPC ......... 438/478, 482, 483, 763, 761, 765, 767, 438/770–777
See application file for complete search history.

(56) References Cited

U.S. PATENT DOCUMENTS

| | | |
|---|---|---|
| 5,275,668 A | 1/1994 | Dell et al. |
| 6,079,353 A | 6/2000 | Leksell et al. |
| 6,143,077 A | 11/2000 | Ikeda et al. |
| 6,416,822 B1 | 7/2002 | Chiang et al. |
| 6,972,055 B2 | 12/2005 | Sferlazzo |
| 7,943,527 B2 | 5/2011 | Kumar et al. |
| 2004/0129212 A1 | 7/2004 | Gadgil et al. |
| 2005/0084610 A1 | 4/2005 | Selitser et al. |
| 2005/0092247 A1 | 5/2005 | Schmidt et al. |
| 2008/0124945 A1 | 5/2008 | Miya et al. |
| 2009/0017190 A1 | 1/2009 | Sferlazzo et al. |
| 2009/0130858 A1 | 5/2009 | Levy |
| 2009/0304924 A1 | 12/2009 | Gadgil |

(Continued)

FOREIGN PATENT DOCUMENTS

| | | |
|---|---|---|
| CN | 1436602 A | 8/2003 |
| JP | S62-081018 A | 4/1987 |

(Continued)

OTHER PUBLICATIONS

Chinese First Office Action, Chinese Application No. 201080025311.3, Jun. 25, 2013, 14 pages.

(Continued)

*Primary Examiner* — Kevin M Picardat
(74) *Attorney, Agent, or Firm* — Fenwick & West LLP

(57) ABSTRACT

A vapor deposition reactor includes a chamber filled with a first material, and at least one reaction module in the chamber. The reaction module may be configured to make a substrate pass the reaction module through a relative motion between the substrate and the reaction module. The reaction module may include an injection unit for injecting a second material to the substrate. A method for forming thin film includes positioning a substrate in a chamber, filling a first material in the chamber, moving the substrate relative to a reaction module in the chamber, and injecting a second material to the substrate while the substrate passes the reaction module.

12 Claims, 17 Drawing Sheets

(56) References Cited

U.S. PATENT DOCUMENTS

| | | |
|---|---|---|
| 2010/0055347 A1 | 3/2010 | Kato et al. |
| 2010/0124618 A1 | 5/2010 | Kobayashi et al. |
| 2012/0021252 A1 | 1/2012 | Lee |
| 2012/0027953 A1 | 2/2012 | Lee |

FOREIGN PATENT DOCUMENTS

| | | |
|---|---|---|
| JP | H01-096924 A | 4/1989 |
| JP | H01-223724 A | 9/1989 |
| JP | H02-187018 A | 7/1990 |
| JP | H04-092414 A | 3/1992 |
| JP | H09-064000 A | 3/1997 |
| JP | 10-507994 | 8/1998 |
| JP | H11-285882 A | 10/1999 |
| JP | 2001-357780 A | 12/2001 |
| JP | 2002-339075 A | 11/2002 |
| JP | 2003-174019 A | 6/2003 |
| JP | 2004-010949 A | 1/2004 |
| JP | 2005-089781 A | 4/2005 |
| JP | 2007-266093 A | 10/2007 |
| JP | 2008-108895 A | 5/2008 |
| JP | 2009-531535 A | 9/2009 |
| WO | WO 2006/054854 A1 | 5/2006 |
| WO | WO 2008/130369 A1 | 10/2008 |
| WO | WO 2009/042147 A1 | 4/2009 |

OTHER PUBLICATIONS

Japanese First Office Action, Japanese Application No. 2012-514229, Jul. 17, 2013, 8 pages.

Japanese Office Action, Japanese Application No. 2012-532219, Sep. 10, 2013, 7 pages.

European Examination Report, European Patent Application No. 10786646.9, Oct. 24, 2013, 5 pages.

Taiwan Office Action, Taiwan Application No. 100126066, Oct. 8, 2013, 14 pages.

U.S. Appl. No. 13/904,825, filed May 29, 2013, Inventor: Sang In Lee.

203

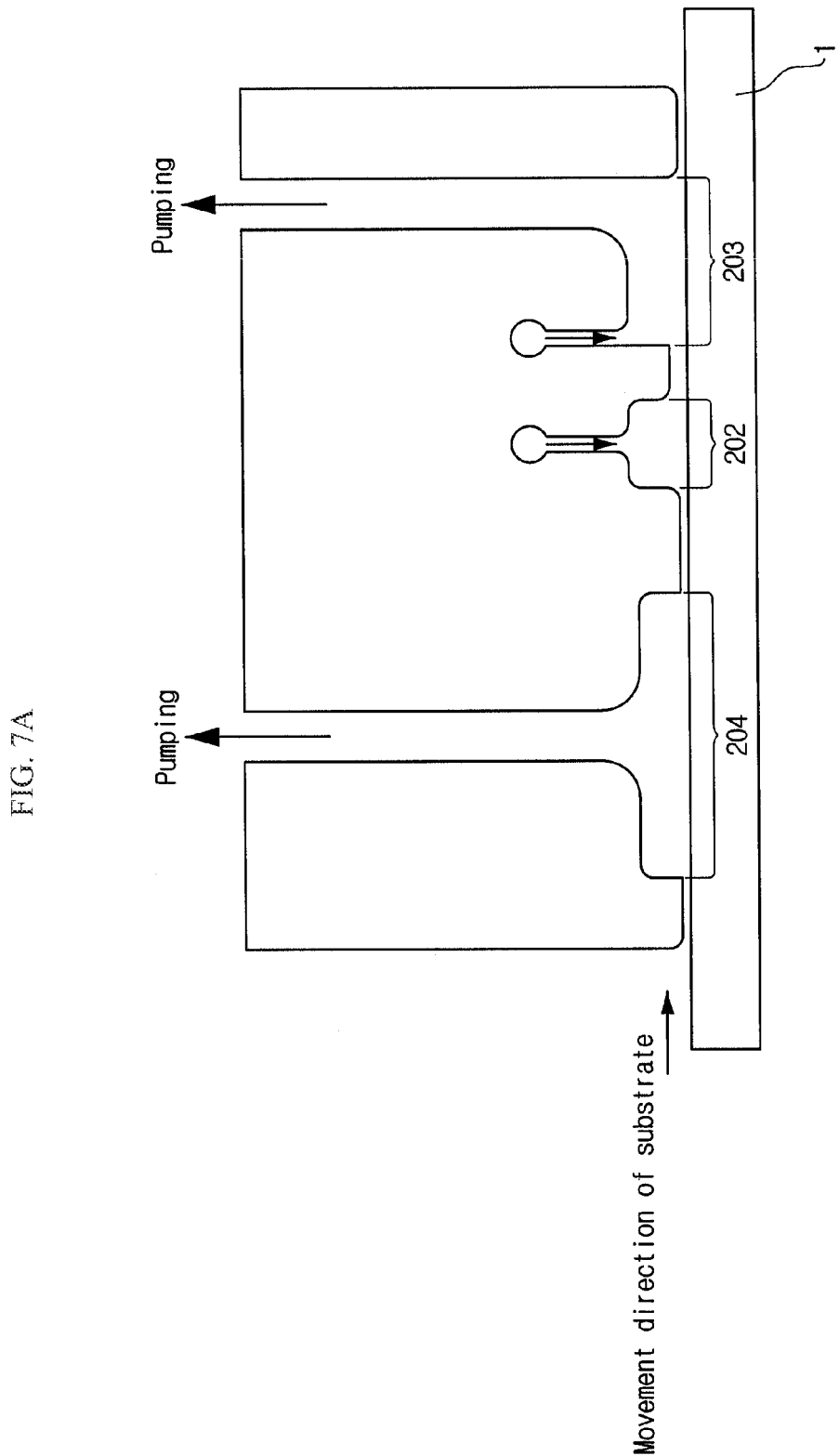

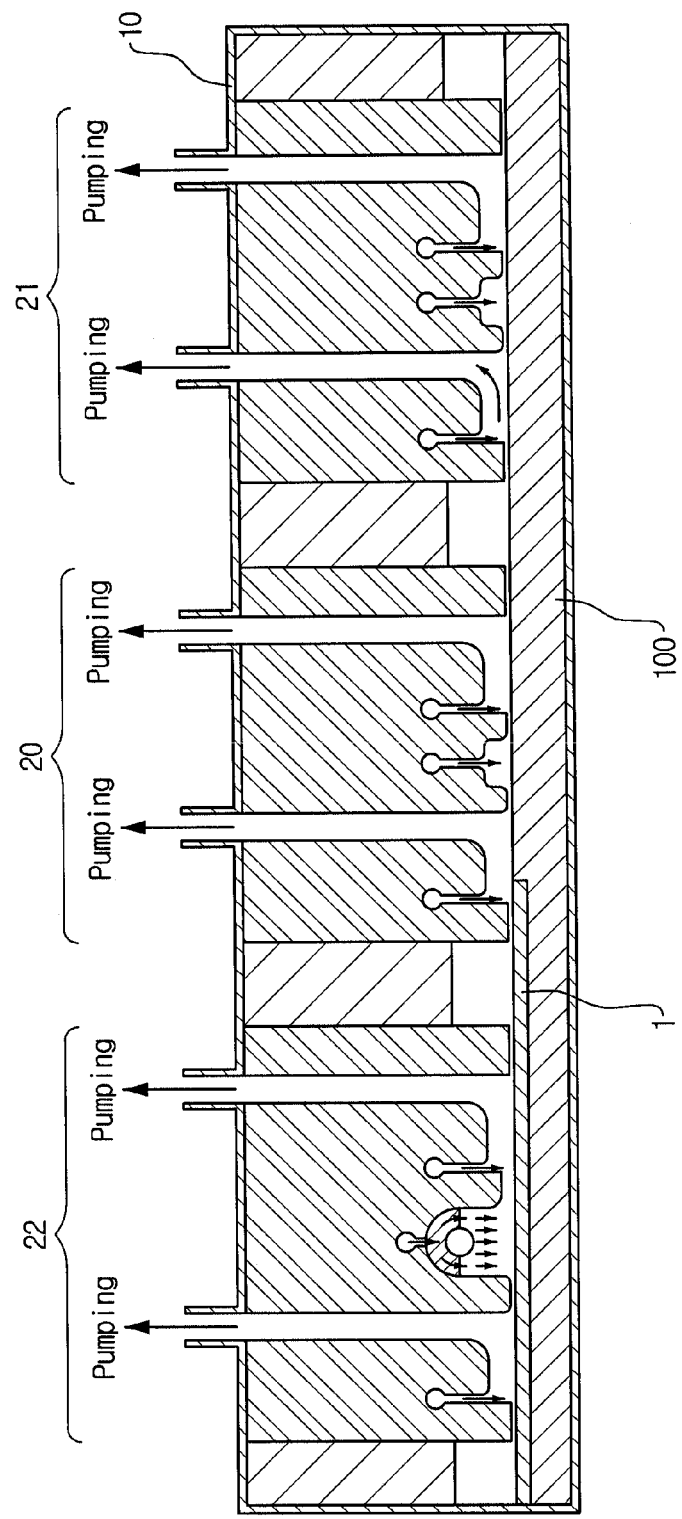

US 8,691,669 B2

VAPOR DEPOSITION REACTOR FOR FORMING THIN FILM

CROSS-REFERENCE TO RELATED APPLICATION

This application is a divisional application of U.S. patent application Ser. No. 12/539,477 filed on Aug. 11, 2009, which claims priority under 35 U.S.C. §119(e) to co-pending U.S. Provisional Patent Application No. 61/088,674 filed on Aug. 13, 2008, which are incorporated by reference herein in their entirety.

BACKGROUND

1. Field of Art

This invention relates to a vapor deposition reactor and a method for forming thin film on a substrate.

2. Description of the Related Art

Semiconductor materials include silicon-based semiconductors such as Si and SiGe, metal oxide semiconductors such as ZnO, group III-V compound semiconductors such as GaAs, GaP, GaN, AlGaAs and InP; and group II-VI compound semiconductors such as CdSe, CdTe, ZnS and CdHgTe. Semiconductor devices are manufactured using these as substrate material, forming metal films or insulating films on the substrate material, and carrying out processes such as photolithography, etching, cleaning and thin film deposition.

When fabricating a metal-oxide-semiconductor field-effect transistor (MOSFET) that is widely used in highly integrated circuits, an insulating film is formed on a semiconductor substrate. The insulating film is used as the gate insulating film for the transistor. Then, a metal film is formed on the substrate so that voltage or current required for driving the device can be applied. The reaction between the substrate and the metal film or the insulating film is important. In some cases, even a slight reaction may change properties of semiconductor devices. Therefore, a precise interface control is required to fabricate properly functioning semiconductor devices.

Deposition techniques associated with such fabrication processes are gradually shifting from chemical vapor deposition (CVD) such as low-pressure CVD (LPCVD) process (performed in a furnace) to atomic layer deposition (ALD) process. Generally, ALD process consists of four stages: (i) injection of a source precursor, (ii) removal of a physical adsorption layer, (iii) injection of a reactant precursor, and (iv) removal of a physical adsorption layer.

Because the source precursor is deposited on the semiconductor substrate after removing natural oxide films from the semiconductor substrate using HF or other chemical substances, the source precursor comes in direct contact with the semiconductor substrate. While the source precursor remains in contact with the substrate, mutual diffusion or formation of unwanted interface may occur on the surface of the semiconductor substrate due to the reaction between the substrate and the source precursor. In case the semiconductor device has a sufficiently large design rule, such phenomena has minimal effect on the properties of the semiconductor device. However, if the design rule is about 32 nm or smaller, as in nano devices or quantum devices, the reactions at the interface or the unwanted formation of interface may become relevant.

FIG. 1 is a flowchart illustrating ALD process according to a conventional technique. Referring to FIG. 1, ALD process may include: loading a substrate (S11), passing the substrate by a source precursor injection module to inject a source precursor (S12), passing the substrate by a purge/pumping module to remove a physical adsorption layer from the source precursor (S13), passing the substrate by a reactant precursor supply module to inject a reactant precursor (S14), and passing the substrate by a purge/pumping module to remove a physical adsorption layer from the reactant precursor (S15). The above steps may be repeated until a layer with desired final thickness is obtained (S16). To perform these steps, an expensive valve that sequentially supplies the source precursor, purge gas, reactant precursor, and a purge gas to the substrate is needed.

The reactors used for CVD generally inject a source gas from a showerhead type source injector that is located above the substrate. The reactors for ALD process may be classified largely into two types: (i) a cross-flow type (or travelling-wave type) that injects a reactant precursor and a purge gas in a direction parallel to the surface of the substrate, and (ii) a showerhead type that injects the reactant precursor and the purge gas in a direction perpendicular onto the surface of the substrate.

Korean Patent No. 10-0760428 discloses an example of a vapor deposition reactor for ALD. The vapor deposition reactor of the Korean Patent No. 10-0760428 is designed with a unit module capable of forming an atomic layer. The unit module includes an injection unit and an exhaust unit for a source material (which are collectively referred to as a source module), and an injection unit and an exhaust unit for a reactant (which are collectively referred to as a reactant module). The source module and the reactant module are disposed adjacent to each other.

With a plurality of unit modules, a plurality of atomic layers are obtained with each pass of the substrate across the unit modules. If the unit modules are disposed with certain intervals, chamber atmosphere may exist between the unit modules. The chamber is maintained in a vacuum state using a vacuum pump to remove the chamber atmosphere. As the size of the apparatus increases and more substrates are simultaneously loaded, the interior capacity of the chamber increases accordingly. The increased capacity in turn requires a higher-capacity vacuum pump to maintain the interior of the chamber in the vacuum state.

SUMMARY

Embodiments provide a vapor deposition reactor that fills a chamber with a material and prevents a substrate from being exposed to chamber atmosphere as the substrate passes a reaction module. The vapor deposition reactor may increase area efficiency of the vapor deposition reactor by minimizing the area or volume of the vapor reactor, and simplify vapor deposition process. The vapor deposition reactor may produce a thin film on the substrate.

In one embodiment, the vapor deposition reactor includes a chamber filled with a first material, and at least one reaction module contained in the chamber. Relative motion between the substrate and the reaction module causes the substrate to pass by the reaction module. The reaction module may include an injection unit for injecting a second material onto the substrate.

In one embodiment, the reaction module further includes a first exhaust unit for removing a portion of an adsorption layer of the first material adsorbed in the surface of the substrate, and a second exhaust unit for removing a portion of an adsorption layer of the second material adsorbed in the surface of the substrate. Each of the first exhaust unit and the second exhaust unit includes a purge port for injecting a purge gas, and a pumping port for discharging, from the chamber, the purge gas and the adsorption layer desorbed from the substrate.

Embodiments also relate to a method for forming a thin film. A substrate is placed in a chamber. The chamber is filled with a first material. The substrate is moved relative to a reaction module in the chamber. A second material is injected onto the substrate as the substrate passes the reaction module.

In one embodiment, before or after the reaction module injects the second material onto the substrate, a portion of the adsorption layer of the first material on the substrate and a portion of the adsorption layer of the second material on the substrate are removed.

BRIEF DESCRIPTION OF THE DRAWINGS

FIGS. 7A and 7B are cross-sectional views of a reaction module of a vapor deposition reactor, according to embodiments.

FIG. 10 is a cross-sectional view of a vapor deposition reactor, according to another embodiment.

DETAILED DESCRIPTION OF THE INVENTION

Figure 1:
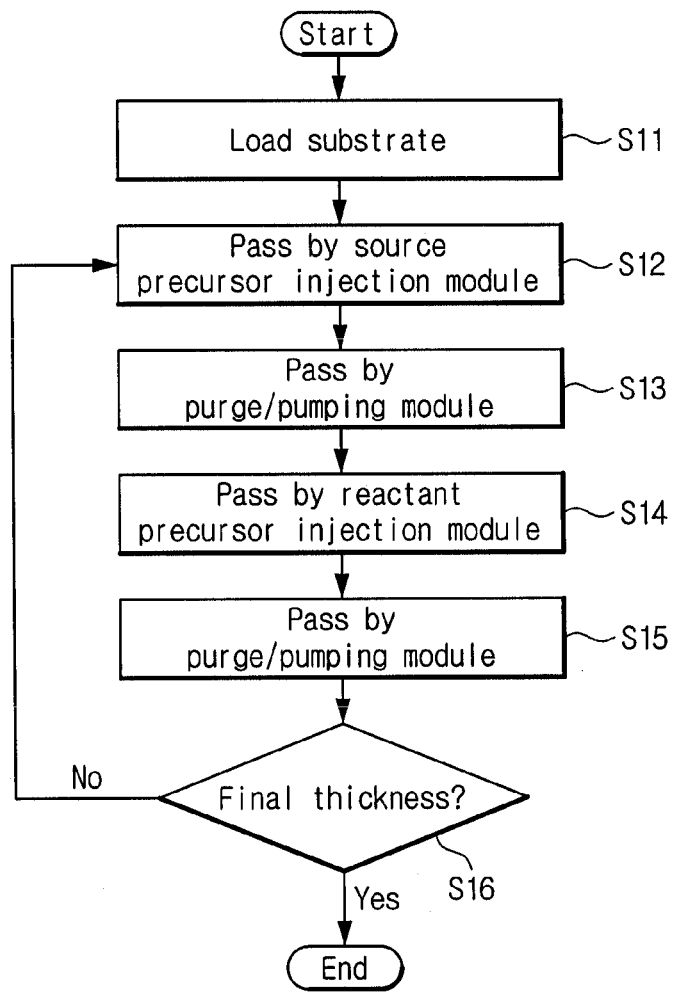
FIG. 1 is a flowchart illustrating atomic layer deposition (ALD) process, according to a conventional process.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first", "second", and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of at least one other features, regions, integers, steps, operations, elements, components, and/or groups thereof.

In the drawings, like reference numerals in the drawings denote like elements. The shape, size and regions, and the like, of the drawing may be exaggerated for clarity.

Figure 2:
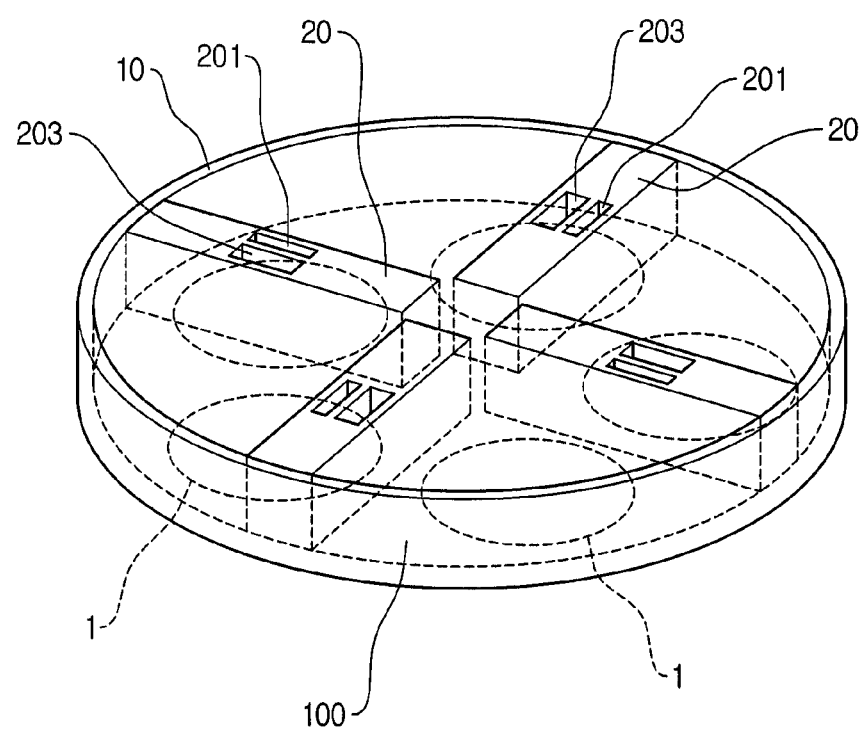
FIG. 2 is a schematic perspective view of a vapor deposition reactor, according to one embodiment.

FIG. 2 is a schematic perspective view of a vapor deposition reactor according to one embodiment. The vapor deposition reactor may include, among others, a chamber 10 and at least one reaction module 20 in the chamber 10. The at least one substrate 1 is loaded on a support 100 in the chamber 10. The interior of the chamber 10 may be filled with a first material. If the vapor deposition reactor is used for atomic layer deposition (ALD), the first material may be a reactant precursor.

In general, the reactant precursor is a gas with high vapor pressure such as $H_2O$, $O_2$, $O_3$, $NH_3$ and $H_2$. Hence, the reactant precursor may diffuse quickly and uniformly within confined space such as the interior of the chamber 10. Accordingly, the reactant precursor may be uniformly adsorbed in the surface of the substrate 1 without the need for any specially designed injection apparatus. By omitting the injection apparatus, the size of the reactor may be reduced and more reactors may be installed on the same area (footprint). In this way, the throughput of the reactor may be increased, reducing cost and effort associated with designing an injection apparatus of the reactant precursor.

The first material may be filled in the chamber 10 with a predetermined flow rate or pressure. For this purpose, a controller (not shown) for controlling the flow rate or pressure of the first material may be equipped in the chamber 10. Further, an inert gas such as Ar may be used as a carrier gas to control the flow rate of the first material and the pressure inside the chamber 10.

If needed to lower the base vacuum level of the chamber 10 to $10^{-3}$ Torr or lower pressure to form a thin film (e.g., a metal film) susceptible to residual oxygen, a vacuum pump such as a turbo-molecular pump (TMP) may be equipped in the chamber 10. Further, because the temperature of the substrate 1 and the first material affects the reaction, a heating apparatus (not shown) may be equipped to control the temperature inside the chamber 10. When the heating apparatus is disposed below the chamber 10 to heat the substrate 1 indirectly by heating the susceptor 101 in the support 100, the space used for deposition and the space for heating apparatus are separated by the support 100. The heating apparatus may be purged by injecting an inert gas such as Ar such that the first and second materials used for deposition do not flow into the heating apparatus. The pressure of the injected purge gas may be controlled to be not lower than that of the space used for deposition so that the purge gas does not deteriorate deposition properties.

Although the chamber 10 illustrated in FIG. 2 has a cylindrical shape, this is merely illustrative. The chamber 10 may have any other arbitrary shape as long as the chamber 10 can accommodate the substrate 1 and the reaction module 20. The shape of the substrate 1 is also not limited to the disc shape illustrated in FIG. 2, but may be any arbitrary shape.

The at least one reaction module 20 may be fixed inside the chamber 10 but the support 100 holding the substrate 1 may rotate. The rotating speed of the support 100 may be constant. Alternatively, the rotating speed of the support 100 may be controlled using a computing device to vary the rotating speed depending on positions. As the support 100 rotates, the substrate 1 may pass below the reaction module 20. In another embodiment, the substrate 1 may be fixed and the reaction module 20 may be rotated to generate a relative motion between the substrate 1 and the reaction module 20.

In the vapor deposition reactor of the above embodiment, the relative motion between the substrate 1 and the reaction module 20 is rotation. In other embodiments, the relative motion between the substrate 1 and the reaction module 20 may be a linear or reciprocal motion.

While the substrate 1 passes below the reaction module 20, the substrate 1 may be separated from the bottom surface of the reaction module 20 by a predetermined distance to maintain a non-contact state. The substrate 1 passing below the reaction module 20 may be isolated from the first material atmosphere in the chamber 10 or may be in minimal contact with the first material. For this purpose, the substrate 1 and the bottom surface of the reaction module 20 may approach a proximate distance. In one embodiment, the reaction module 20 is equipped with a gas curtain or an exhaust device at its edge. In this way, the reaction module is isolated from material in other parts of the chamber 10.

The reaction module 20 may include, among other components, (i) a first section for removing and discharging a physical adsorption layer of the first material on the substrate 1, and (ii) a second section for forming a thin film by injecting a second material onto the substrate 1. The second section may also remove and discharge a physical adsorption layer of the second material absorbed in the substrate 1. The exhaust lines for each of these sections are illustrated as exhaust units 201, 203 in the reaction module 20. During discharge, the first and second materials are not mixed. Each of the first and second material may be accumulated before discharging. That is, materials from the exhaust unit 201 of each of the reaction module 20 may be accumulated before discharging. Likewise, materials from the exhaust unit 203 of each of the reaction module 20 may be accumulated before discharging.

For example, the first material in the chamber 10 may be a reactant precursor, and the second material injected by the reaction module 20 may be a source precursor. In this way, an atomic layer is formed on the substrate 1 as the substrate passes below the reaction module 20.

The first material (i.e., the reactant precursor) may be a material for obtaining metal, oxide, nitride, carbide or semiconductor material from a chemical source. For example, the first material may include $H_2O$, $H_2O_2$, $O_2$, $N_2O$, $O_3$, O* radical, $NH_3$, $NH_2$—$NH_2$, $N_2$, N* radical, organic carbon compounds such as $CH_4$, $C_2H_6$, etc., $H_2$, H* radical, or other suitable materials. The first material may also include a combination of two or more of these materials.

The second material (i.e. the source precursor) may be a material capable of forming a thin film on the substrate 1 by reaction and/or substitution with the first material. A variety of materials may be used as the source precursor depending on the kind of thin film formed on the substrate. For example, in case the thin film is made of a semiconductor, the source precursor may be group IV compounds, III-V compounds, II-VI compounds, or the like. In case the thin film is made of a metal, the source precursor may be Ni-based compounds, Co-based compounds, Al-based compounds, Ti-based compounds, Hf-based compounds, Zr-based compounds, Ta-based compounds, Mo-based compounds, W-based compounds, or compounds including above materials and Si. In case the thin film is made of a dielectric or a conductive dielectric, the source precursor may be Ni-based compounds, Zn-based compounds, Cu-based compounds, Co-based compounds, Al-based compounds, Si-based compounds, Hf-based compounds, Ti-based compounds, Zr-based compounds, Ta-based compounds, or the like. The source precursor may include a combination of two or more of these materials.

For example, Si-based compounds used as the second material may include $SiH_4$, $SiH_2Cl_2$, or the like. Ti-based compounds used as the second material may include $TiCl_4$, or the like. Al-based compounds used as the second material may include trimethylaluminum (TMA), or the like. Hf-based compounds used as the second material may include tetrakis-ethylmethylaminohafnium (TEMAHf), or the like. Zr-based compounds used as the second material may include tetrakis-ethylmethylaminozirconium (TEMAZr), or the like. The kind of the second materials is not limited to these materials. Other materials not listed herein may also be used depending on the type of the final thin film.

Further, the first material (i.e., the reactant precursor) may be in the form of plasma of these materials, or may be applied along with light such as UV light. Even when the reactant precursor is decomposed by applying plasma, radical, or photon, it is not likely that the byproduct remains in the final thin film or the property of the thin film is deteriorated or degraded. If the reactant precursor is activated by such energy, a sufficient adsorption of molecules may be attained even when Si-based compounds or $TiCl_4$, which do not readily form a thin film, are used as a source precursor. As a result, the rate of thin film deposition may be increased and the surface treatment or interface treatment of the substrate 1 may be facilitated.

The above vapor deposition reactor may be applied to the so-called multi-wafer ALD reactor for loading a plurality of substrates 1. The vapor deposition reactor may be effective when a plurality of precursor injection apparatuses are required. By exposing the substrate 1 first to the reactant precursor and then adsorbing the source precursor during the process of atomic layer deposition, the reaction between the surface of the substrate 1 and the source precursor may be minimized and highly reliable apparatus and process can be obtained.

Figure 3A:
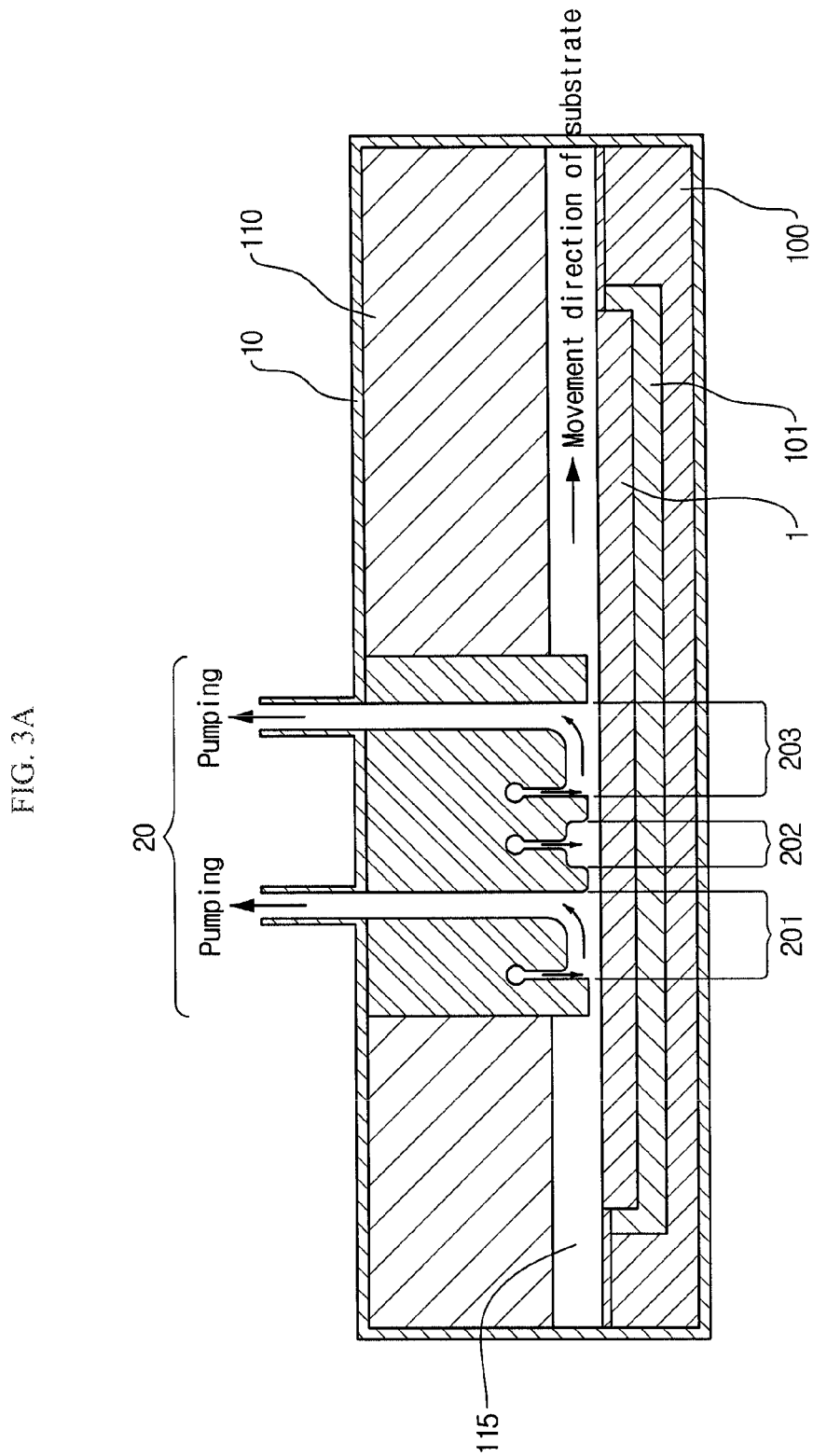
FIG. 3A is a cross-sectional view of a reaction module of a vapor deposition reactor, according to one embodiment.

FIG. 3A is a cross-sectional view of a vapor deposition reactor illustrating a substrate 1 and a reaction module 20 adjacent to each other, according to one embodiment. A substrate 1 fixed by a susceptor 101 of a support 100 moves from the left to the right. That is, the substrate 1 passes below the reaction module 20 from the left to the right. Since the substrate 1 is exposed to first material atmosphere in a chamber 10, a physical and/or chemical adsorption layer of a first material may be formed on the substrate 1 before the substrate 1 passes below the reaction module 20.

In one embodiment, the chamber 10 includes a channel 115 at the region adjacent to the substrate 1. In this case, the first material may be filled in the channel 115, and the remaining region of the chamber 10 excluding the channel 115 may be filled with a filler 110. The filler 110 may be the same material constituting the outer wall of the chamber 10. Such a configuration is economically advantageous because the amount of the first material needed to fill the interior of the chamber 10 may be minimized The reaction module 20 may include an exhaust unit 201, an injection unit 202 and an exhaust unit 203. When the moving substrate 1 is below the exhaust unit 201 of the reaction module 20, the physical adsorption layer of the first material on the substrate 1 is removed by the exhaust unit 201. By injecting a purge gas onto the substrate 1 and pumping the purge gas out of the chamber 10, the exhaust unit 201 may remove the physical adsorption layer of the first material together with the purge gas. As a result, only the chemical adsorption layer of the first material remains on the surface of the substrate 1. In one embodiment, the physical adsorption layer of the first material may be partially removed such that some portion of the physical adsorption layer remains on the substrate 1.

The purge gas may be an inert gas such as $N_2$ gas, Ar gas, He gas, or other suitable materials. Further, the purge gas may include a combination of two or more of these materials.

As the substrate 1 moves to the right, the substrate 1 is placed below the injection unit 202. The injection unit 202 injects a second material to the substrate 1. In one embodiment, the injection unit 202 is a showerhead type injector having a rectangular shape. Alternatively, the injection unit 202 is a pie-shaped injector that accounts for the different angular velocities of inner portions and outer portions of the substrate as the support 100 rotates. By using the pie-shaped injector, the uniformity of the thin film may be improved. The second material injected by the injection unit 202 is a material for forming a thin film by reacting with and/or substituting the first material. For example, if the vapor deposition reactor is used for ALD, the first material may be a reactant precursor and the second material may be a source precursor.

If the substrate 1 on which thin film is formed by the injection of the second material further moves to the right and is placed below the exhaust unit 203, the adsorption layer of the second material is partially removed by the exhaust unit 203 by injection and pumping of a purge gas. Because the configuration and function of the exhaust unit 203 are essentially the same as those of exhaust unit 201, a detailed description is omitted for the purpose of brevity.

By the above process, purge/pumping, injection of the second material, and purge/pumping are performed sequentially as the substrate 1 passes below the reaction module 20. Since the substrate 1 is exposed to the first material atmosphere in the chamber 10 before the substrate 1 passes the reaction module 20, injection of the first material, purge/pumping, injection of the second material, and purge/pumping may be performed while the substrate 1 is loaded in the chamber 10 and passes below the reaction module 20. As a result, a thin film is formed on the substrate 1.

After passing below the reaction module 20, the substrate 1 is exposed again to the first material atmosphere in the chamber 10. Hence, a physical and/or chemical adsorption layer of the first material may be formed again on the substrate 1. In this state, as the substrate 1 is passed below another reaction module 20, another thin film is formed on top of the previously formed thin film. For example, in the exemplary embodiment of FIG. 2, a substrate 1 passes below four reaction modules 20 during one full rotation of the support 100. Therefore, four thin film layers are formed on the substrate 1 during one rotation of the support 100.

In one embodiment, the substrate 1 itself may be rotated around its own axis while the support 100 also rotates. The rotation direction of the substrate 1 may be the same as or be opposite to the rotational direction of the support 100.

Figure 3B:
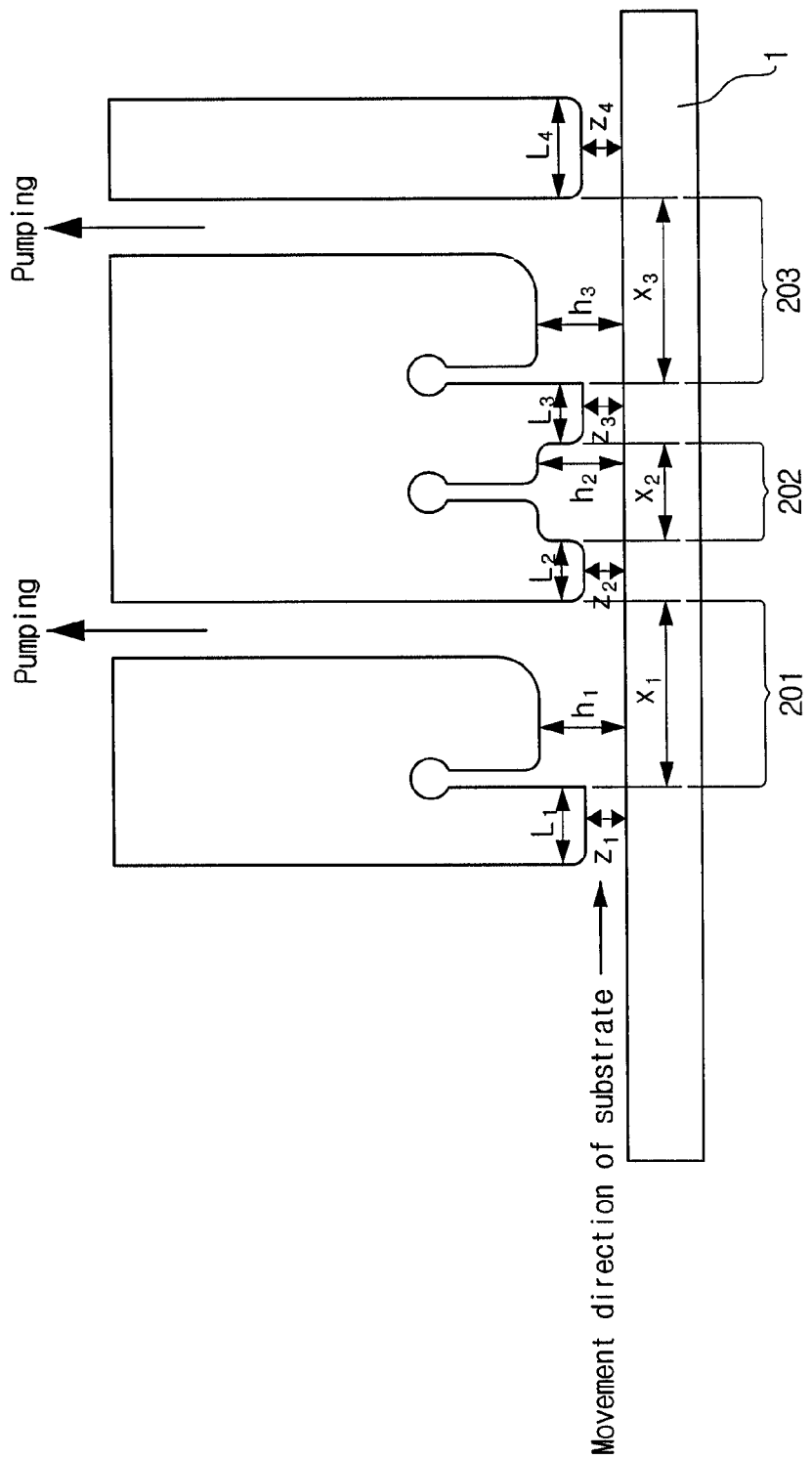
FIG. 3B is a partially enlarged view of the vapor deposition reactor of FIG. 3A, according to one embodiment.

FIG. 3B is an enlarged cross-sectional view of the substrate 1 and the reaction module 20 of FIG. 3A for describing parameters related to the thin film formation, according to one embodiment. The parameters related to formation of the thin film include, for example, aperture $x_1$ of the exhaust unit 201, aperture $x_2$ of the injection unit 202, aperture $x_3$ of the exhaust unit 203, distances $z_1$-$z_3$ from the substrate 1 to different parts of the exhaust unit 201, volumes obtained by multiplying cross sections by length ($x_1 \times h_1$, $x_2 \times h_2$, $x_3 \times h_3$), and widths $L_1$-$L_4$ of first to fourth guards separating each portion of the reactor. In addition, moving speed and temperature of the substrate 1, flow rate or pressure of the first material, the second material and the purge gas, pumping speed of the exhaust units 201, 203, or the like may also affect the reaction.

The time for each process of forming a thin film may be calculated, as described herein. If the moving speed of the substrate 1 is v, the time during which the first material is adsorbed in the chamber 10 may be calculated as [total moving distance−total length of reaction module 20]/v. The total moving distance may be regarded as being equal to the circumference of the circle on which the substrate 1 is placed. The total length of the reaction module 20 may be calculated as $L_1+x_1+L_2+x_2+L_3+x_3+L_4$. And, the purge/pumping time by the exhaust unit 201 may be calculated as $x_1/v$, the second material injection time by the injection unit 202 as $x_2/v$, and the purge/pumping time by the exhaust unit 203 as $x_3/v$, respectively.

Because the substrate 1 passes below the reaction module 20 in a non-contact manner, $z_1$ to $z_4$ may be positive values. Also, $z_1$ to $z_4$ may be set to prevent or minimize contact of the substrate 1 passing below the reaction module 20 with the first material in the chamber 10. Further, by increasing the width $L_4$ of the outer guard, the contact of the reaction module 20 with the first material in the chamber 10 may be prevented or minimized Furthermore, a gas curtain or an exhaust device may be added to an edge of the outer guards.

These parameters may be determined adequately depending on the desired reaction, the materials used or other related conditions. For example, if a material with a relatively low partial gas pressure such as TEMAHf and TEMAZr is injected by the injection unit 202, the aperture $x_2$ of the injection unit 202 may be increased or the moving speed of the substrate 1 may be decreased. On the contrary, if a material with a relatively high partial gas pressure such as TMA and $TiCl_4$ is injected by the injection unit 202, the moving speed of the substrate 1 may be increased. The increase speed of the substrate 1 may contribute to increased productivity.

In one embodiment, factors such as the apertures $x_1$ and $x_3$, heights $h_1$ and $h_3$ of the exhaust units 201 and 203, pumping speeds of the exhaust units 201 and 203, and flow rate of the purge gas may be controlled such that only a portion of the physical adsorption layer is desorbed and removed from the substrate 1 by the exhaust units 201 and 203. In this case, some portion of the adsorption layer remains on the substrate 1 with the chemical adsorption layer. The rate of deposition of the thin film may be improved compared to the rate of forming a pure atomic layer thin film.

Referring to FIGS. 2 and 3B, the distance between each reaction module 20 may be set to sufficiently induce the adsorption of the first material into the substrate 1. For example, if the relative movement between the substrate 1 and the reaction module 20 is linear, the minimum distance between each reaction module 20 may be the aperture $x_2$ of the injection unit 202 of each reaction module 20. Further, the distance between each reaction module 20 may also be determined based on the pressure of the first material in the chamber 10.

By installing as many reaction modules 20 as possible in the chamber 10 (subject to the constraints imposed by the distance between each reaction module 20), a larger number of thin film layers may be formed on the substrate 1 during a single rotation of the support 100. For example, about 5 to about 10 atomic layers may be formed on the substrate 1 per a single rotation of the support 100. This significantly increases the productivity of the process.

Figure 4:
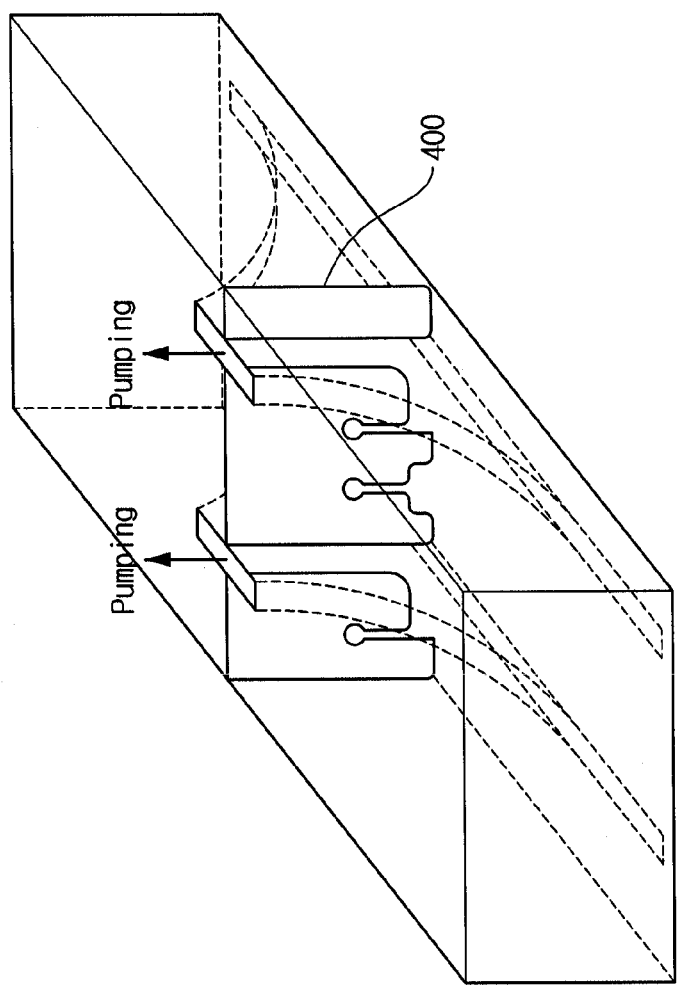
FIG. 4 is a schematic perspective view of a reaction module of a vapor deposition reactor, according to one embodiment.

FIG. 4 is a schematic perspective view of the reaction module reaction module 20, according to one embodiment. In FIG. 4, the cross section 400 corresponds to the cross section of the reaction module 20 illustrated in FIGS. 3A and 3B.

Figure 5:
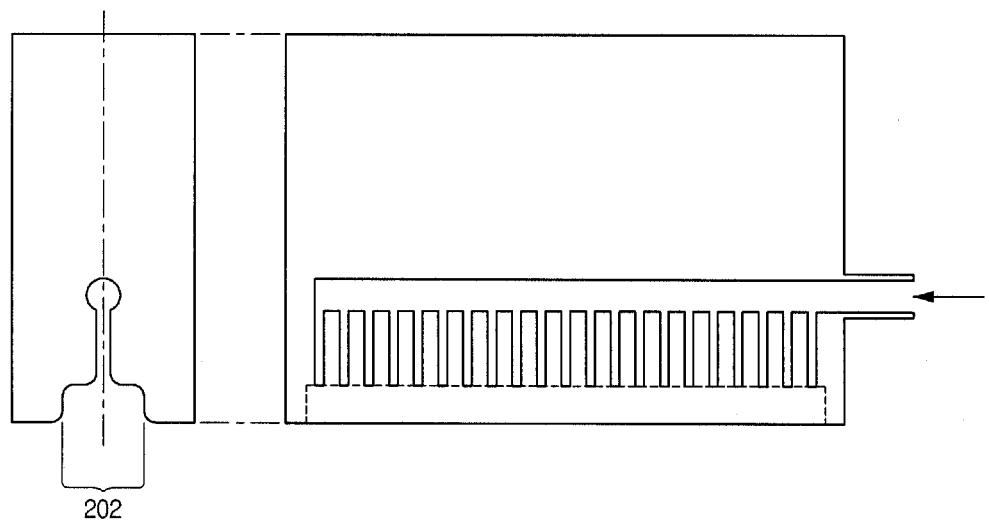
FIG. 5 is a side cross-sectional view of an injection unit of a vapor deposition reactor, according to one embodiment.

FIG. 5 is a side cross-sectional view of the injection unit 202, according to one embodiment. As illustrated in FIG. 5, a second material is injected through a pipe type channel. The second material may be injected to a substrate below the injection unit 202 through at least one hole formed in the channel. Each hole may have the same or different size.

Figure 6A:
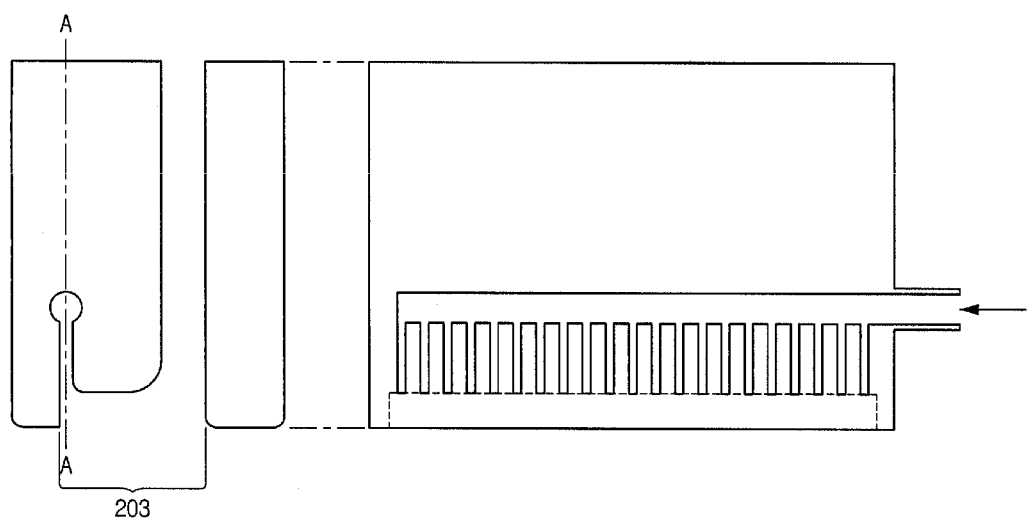
FIGS. 6A and 6B are side cross-sectional views of an exhaust unit of a vapor deposition reactor, according to one embodiment.
Figure 6B:
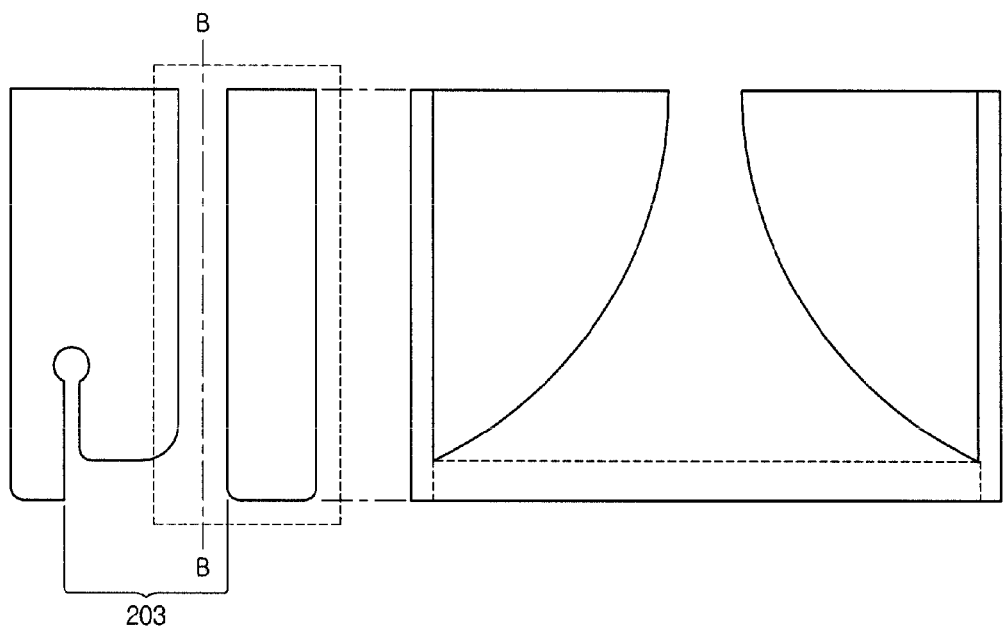
Figure 6C:
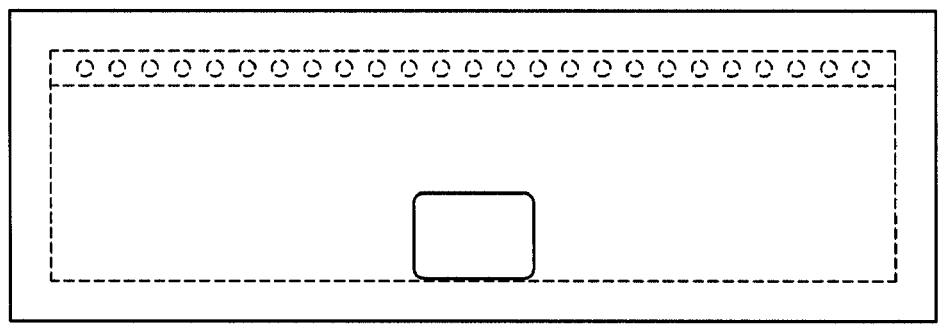
FIG. 6C is a plan view of an exhaust unit of a vapor deposition reactor, according to one embodiment.
Figure 6D:
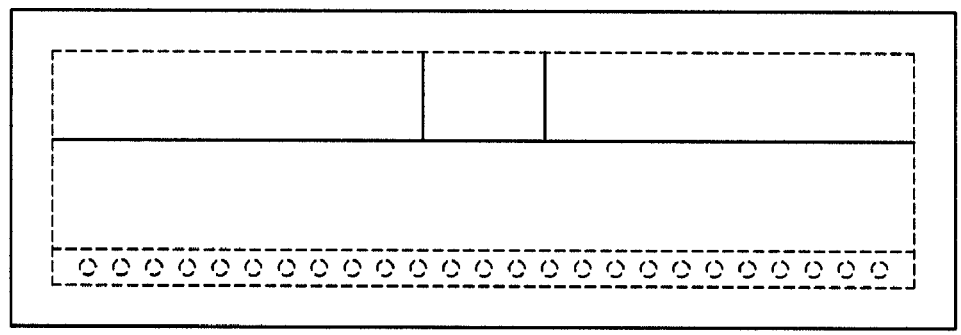
FIG. 6D is a bottom view of an exhaust unit of a vapor deposition reactor, according to one embodiment.

FIG. 6A is a side cross-sectional view of a purge port (A-A) of the exhaust unit 203, according to one embodiment. FIG. 6B is a side cross-sectional view of a pumping port (B-B) of the exhaust unit 203, according to one embodiment. FIGS. 6C and 6D are a plan view and a bottom view of the exhaust unit 203, according to one embodiment, respectively. Referring to FIGS. 6A to 6D, the purge port of the exhaust unit 203 is similar to the injection unit 202 of FIG. 5 except that a purge gas is injected instead of the second material. The pumping port of the exhaust unit 203 has a discharge outlet formed on the upper portion for discharging the pumped material. For effective pumping, the side surface of the pumping port may be curved. The exhaust unit 201 may also have the same configuration as that of the exhaust unit 203 illustrated in FIGS. 6A to 6D.

The configuration of the reaction module 20 in the above-described embodiments is merely illustrative. In other embodiments, the reaction module 20 is configured differently in various forms. For example, the purge port may be separated from the pumping port in other embodiments. Also, the reaction module may be configured in various forms such as purge port/pumping port/injection unit, purge port/pumping port/injection unit/pumping port, purge port/pumping port/injection unit/pumping port/purge port, purge port/ pumping port/injection unit/purge port/pumping port, purge port/pumping port/purge port/injection unit/purge port/ pumping port, or the like.

In one embodiment, the guard between the purge port and the pumping port may be removed from the exhaust units 201, 203. In this case, the pumping of the purge gas and the physically adsorbed molecules detached from the substrate 1 may be carried out more easily. In another embodiment, the guard between the injection unit 202 and the purge port of the exhaust unit 203 may be removed such that the injection unit 202 and the exhaust unit 203 are integrated.

FIG. 7A is a cross-sectional view of a reaction module of a vapor deposition reactor, according to another embodiment. Referring to FIG. 7A, a reaction module may include an exhaust unit 204, an injection unit 202 and an exhaust unit 203. The embodiment of FIG. 7A is different from the above embodiments in the exhaust unit 204. The exhaust unit 204 does not have a purge port and only performs pumping. The exhaust unit 204 may have an aperture larger than that of the injection unit 202 or the exhaust unit 203 of different forms. That is, the exhaust unit 204 may have an aperture starting from a pumping port and extending towards the moving direction of a substrate 1 and its opposite direction. The surface of the aperture may be curved.

Figure 7B:
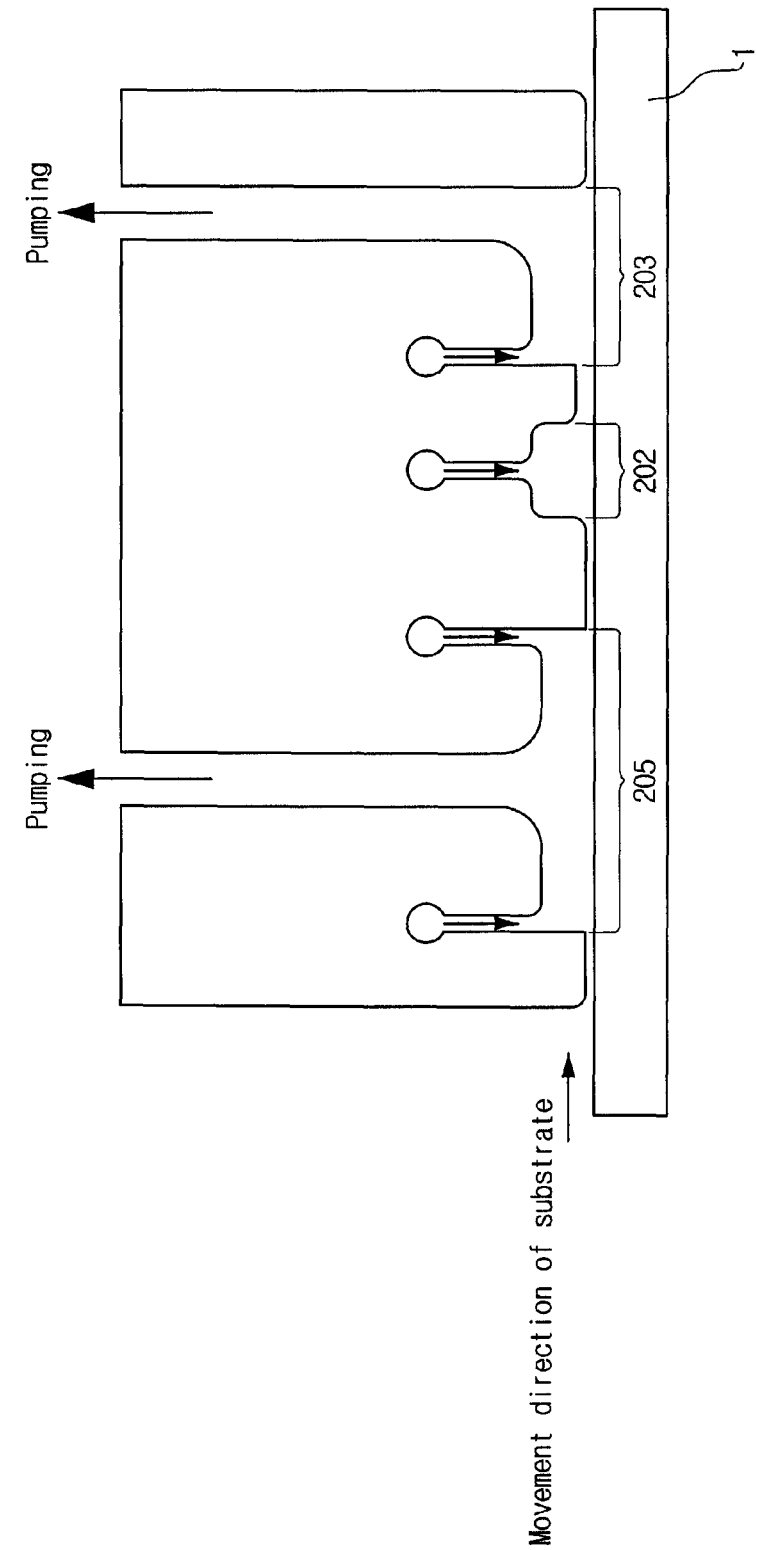

FIG. 7B is a cross-sectional view of a reaction module of a vapor deposition reactor, according to another embodiment. The exhaust unit 205 illustrated in FIG. 7B further includes a purge port compared with the exhaust unit 204 of FIG. 7A. The exhaust unit 205 may include channels for providing a purge gas that starts from the pumping port and extends in the moving direction of a substrate 1 and in its opposite direction. The purge gas supplied by the two channels may be pumped through the pumping port between the two channels together with the molecule physically adsorbed on the substrate 1.

Figure 8:
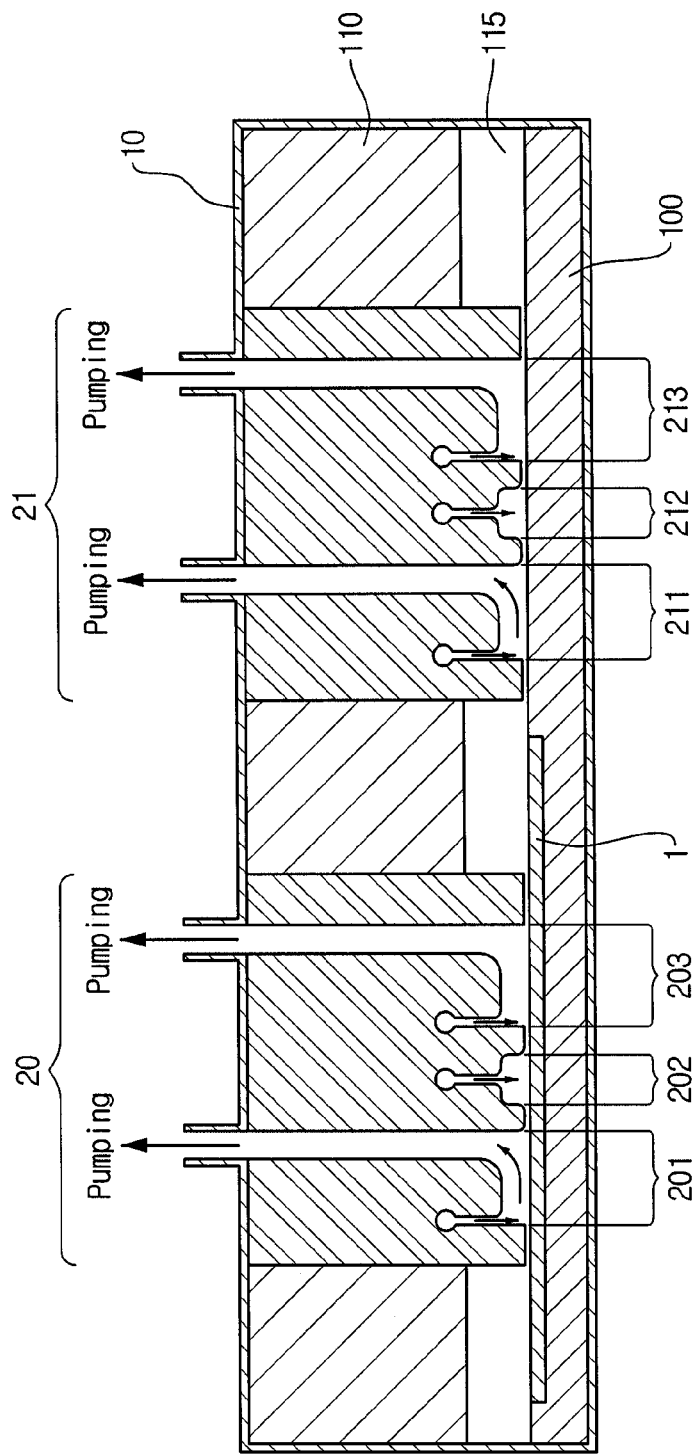
FIG. 8 is a cross-sectional view of a vapor deposition reactor, according to another embodiment.

FIG. 8 is a cross-sectional view of a vapor deposition reactor according to another embodiment. Referring to FIG. 8, a vapor deposition reactor may include, among others, a chamber 10, a first reaction module 20 and a second reaction module 21. Each of the first and second reaction modules 20, 21 includes exhaust units 201, 211, injection units 202, 212 and exhaust units 203, 213 that are sequentially placed. The distance between the first and second reaction modules 20, 21 set to allow sufficient absorption of a first material in the chamber 10 onto a substrate 1 passing between the first and second reaction modules 20, 21. The distance may also be determined based on factors such as the size of the injection units 202, 212 and the pressure of the first material in the chamber 10.

Since the two reaction modules 20, 21 are arranged contiguously, two layers of thin film may be formed on the substrate 1 as the substrate 1 passes below the first and second reaction modules 20, 21. If the same second material is injected by the injection units 202, 212, two layers of the same material may be formed on the substrate 1. For example, in case a $TiO_2$ atomic layer is formed using a second material including Ti metal atom as a source precursor, a homogeneous thin film of, for example, $TiO_2+TiO_2$ or $TiN+TiN$ may be formed.

Further, by varying the reactant precursor filled in the chamber 10 while injecting the same source precursor at the reaction modules 20, 21, a heterogeneous thin film including the same material in each layer may be formed. For example, a heterogeneous thin film of $TiN+TiO_2$ or $TiO_2+TiN$ may be formed. In addition, by injecting different source precursors at the injection units 202, 212 of the reaction modules 20, 21, different types of atomic layers may be formed contiguously. For example, a heterogeneous thin film of $TiO_2+SiO_2$ or $AlN+SiO_2$ may be formed. Further, a multi-layer heterogeneous thin film of, for example, $Al_2O_3+HfO_2+Ta_2O_5$ may also be formed by adding an additional reaction module for injecting a source precursor.

Depending on the type of thin film desired, the vapor deposition reactor according to embodiments may be used in combination with a plasma, ultrahigh frequency wave or UV source. The energy sources may be used in combination in the same process, or may be used in different processes to form thin film.

Figure 9A:
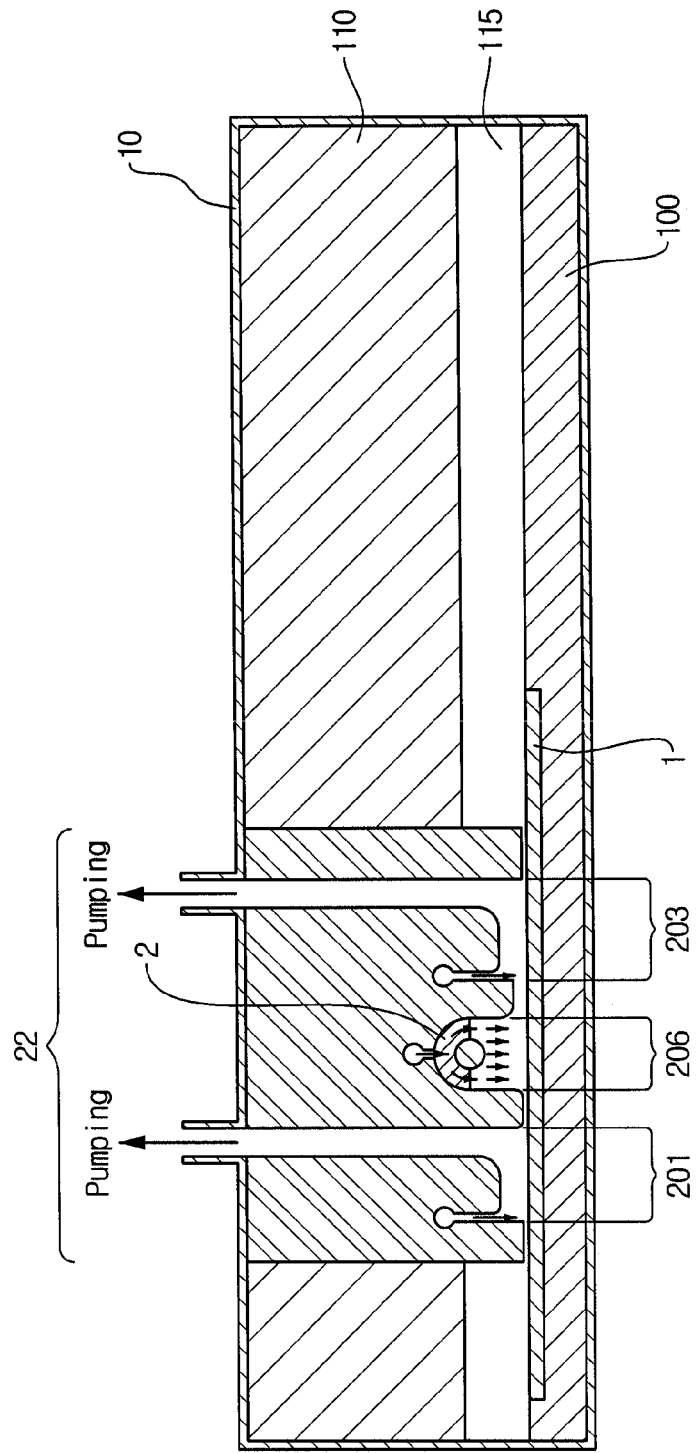
FIGS. 9A and 9B are cross-sectional views of a vapor deposition reactor, according to another embodiment.

FIG. 9A is a cross-sectional view of a vapor deposition reactor according to one embodiment. An injection unit 206 may be used as a plasma source for supplying a second material in the form of plasma 2. For example, in the injection unit 206, a reaction gas for generating plasma is injected in a channel for supplying the second material, and a power may be applied close to holes formed in the channel to generate plasma 2. Coaxial electrodes may be used to generate plasma 2 on the side that is not in direct contact with the substrate 1. That is, in the injection unit 206, the plasma 2 may be generated only on the upper portion adjacent to the channel.

Such an injection unit 206 may be used to excite (or decompose) an inorganic source precursor with plasma and form an atomic layer thin film. The inorganic source precursor is normally difficult to attain in ALD. That is, after inducing a primary reaction (or decomposition) of the source precursor with plasma energy, the source precursor reacts with a reactant precursor. For example, after filling a chamber 10 with $NH_3$, the substrate 1 is loaded and moved (or rotated). Nitrogen atoms generated by thermal decomposition is adsorbed in the substrate 1 during this process. By injecting an inorganic metal source such as $TiCl_4$ or $SiH_4$ onto the substrate 1 as a source precursor, TiN or SiN thin film may be formed on the substrate 1. The resulting thin film may include residual Cl or H, as well as $NH_4Cl$ formed from the reaction of $NH_3$ and Cl.

However, when $TiCl_4$ is injected in the form of plasma 2 using the injection unit 206 of the above embodiment, TiN thin film may be deposited at low temperature because Ti and Cl atoms are decomposed and Ti atoms are adsorbed at low temperature. Further, by injecting the source precursor mixed with $TiCl_4$ and $H_2$ at the injection unit 206, Ti atomic layer or a similar adsorption layer is obtained by the energy of the plasma 2. In this way, incubation or decreased deposition due to poor adsorption may be improved. Further, when forming gas ($N_2+H_2$) is used as a reactant precursor in the chamber 10, Ti thin film may be obtained on the substrate 1. Si thin film may also be obtained in a similar manner.

Although the injection unit 206 is configured to function as a plasma source in the above embodiment, in another embodiment, the injection unit 206 may apply UV light or ultrahigh frequency wave as well as the second material to induce a primary reaction of the second material to induce a final reaction between the second material and the first material.

In accordance with the above embodiments, radicals having a very short lifespan such as hydrogen radical or nitrogen radical may be utilized because plasma is generated directly above the substrate 1. Hence, the radical efficiency may be improved. Further, by moving the substrate 1 while generating nitrogen or hydrogen plasma, a thin film with better quality may be obtained even at low temperature in a large quantity. In addition, a nitride film may be obtained.

In conventional reactors, a single atomic layer has to be formed by increasing the cycle number when using a source precursor without the self-limiting phenomenon (i.e., a source precursor that is not saturated during chemisorption). For example, source precursors such as $TiCl_4$ and $SiH_4$ does not exhibit self-limiting phenomenon. However, when using the vapor deposition reactors according to embodiments, an atomic layer excited by the plasma 2 may be first formed on the substrate 1 for absorbing the reactant precursor. Surface activation sufficiently induces the adsorption of the source precursor. As a result, no additional nucleation process is required and atomic layer can be formed without incubation phenomenon.

Figure 9B:
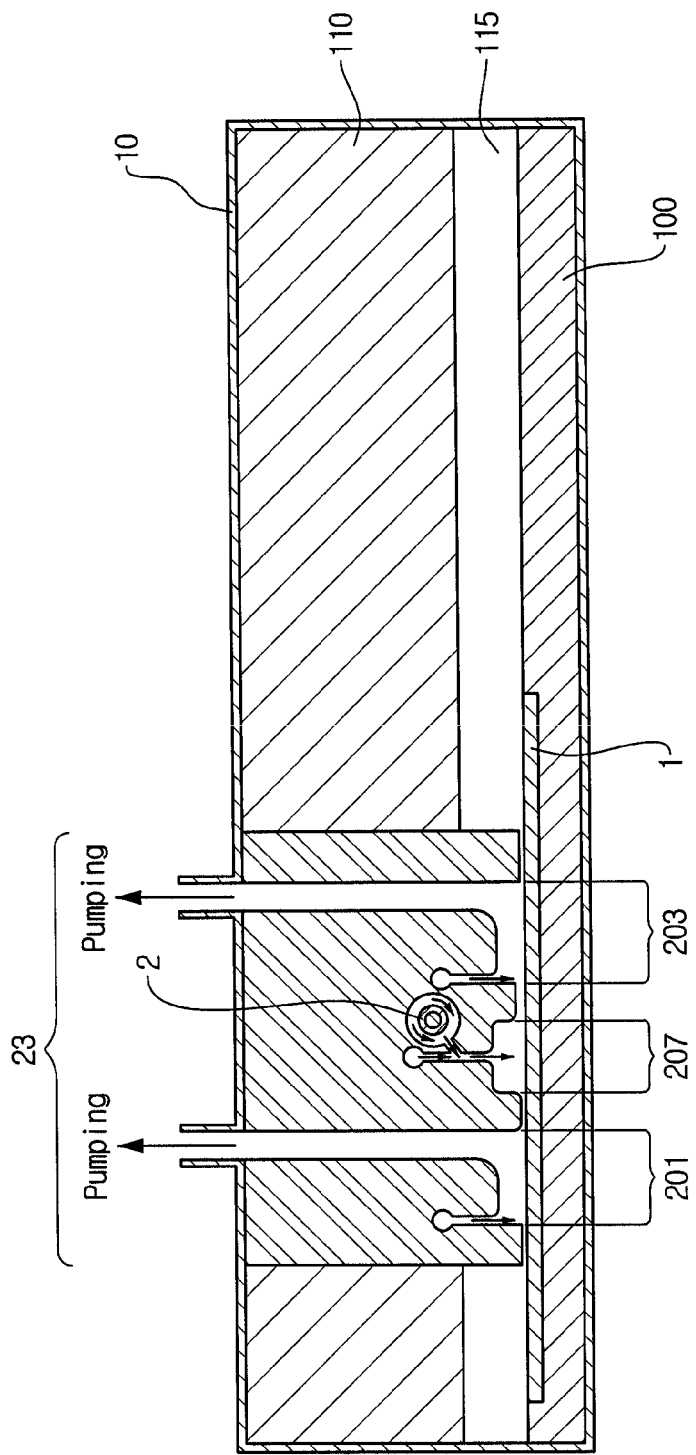

FIG. 9B is a cross-sectional view of a vapor deposition reactor according to one embodiment. In the embodiment of FIG. 9B, remote plasma is used instead of directly exposing plasma 2 to a substrate 1 to prevent damage to the substrate 1 attributable to the plasma 2. An injection unit 207 may include, among others, a channel for injecting a reaction gas for generating plasma, and a separate channel for injecting a second material. The holes formed in each channel are connected with each other to allow supply of both the second material and the plasma 2 to the substrate 1.

FIG. 10 is a cross-sectional view of a vapor deposition reactor according to one embodiment. Referring to FIG. 10, a vapor deposition reactor may include, among others, a chamber 10, a first reaction module 20, a second reaction module 21 and a third reaction module 22. The third reaction module 22 may be configured similar to the embodiment described above with reference to FIG. 9A. The third reaction module 22 applies plasma 2 to a substrate 1. Further, the first and second reaction modules 20, 21 may be configured according to the embodiment described above with reference to FIG. 8. A detailed description on the configuration and other aspects of the embodiment illustrated in FIG. 10 is omitted herein for the sake of brevity.

Figure 11:
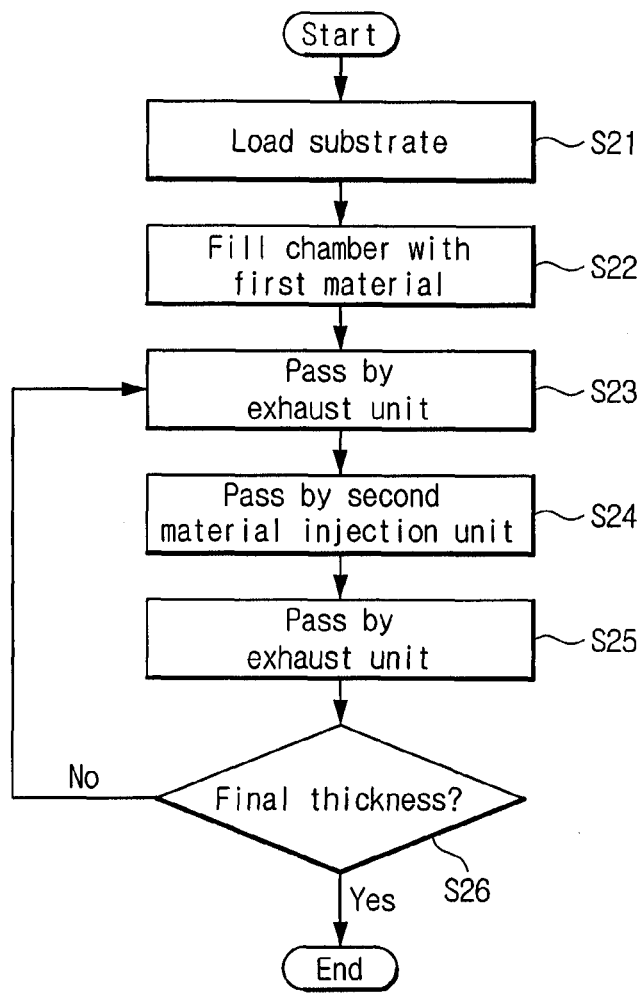
FIG. 11 is a flowchart illustrating a method for forming thin film, according to one embodiment.

FIG. 11 is a flowchart illustrating a method for forming thin film according to one embodiment. Referring to FIG. 11, a substrate is loaded S21 in a chamber. A first material is filled S22 in the chamber. The first material is, for example, a reactant precursor used in ALD. Since the substrate loaded in the chamber is exposed to the first material atmosphere, a physical and/or chemical adsorption layer of the first material may be formed on the substrate.

The substrate passes S23 an exhaust unit of a reaction module. As the substrate passes the exhaust unit, the physical adsorption layer of the first material on the substrate may be removed by injection and pumping of a purge gas. As a result, only the chemical adsorption layer of the first material remains on the substrate. In one embodiment, only a portion of the physical adsorption layer of the first material is removed, leaving another portion of the physical adsorption layer on the substrate.

The substrate passes S24 an injection unit of the reaction module. The injection unit may inject a second material to the substrate. The second material may be a material for forming a thin film by reacting with and/or substituting the first material. For ALD, the second material may be a source precursor. That is, while the substrate passes the injection unit, an atomic layer is formed on the substrate.

The substrate may pass S25 an exhaust unit of the reaction module. As the substrate passes the exhaust unit, a physical adsorption layer of the second material is removed, and only the thin film formed by reaction and/or substitution of the first material with the second material remains on the substrate. In one embodiment, only a portion of the physical adsorption layer of the second material may be removed, leaving another portion of the physical adsorption layer on the substrate.

The above-described injection of the first material, purge/pumping, injection of the second material and purge/pumping are repeated S26 until a thin film of a desired thickness is obtained.

Figure 12:
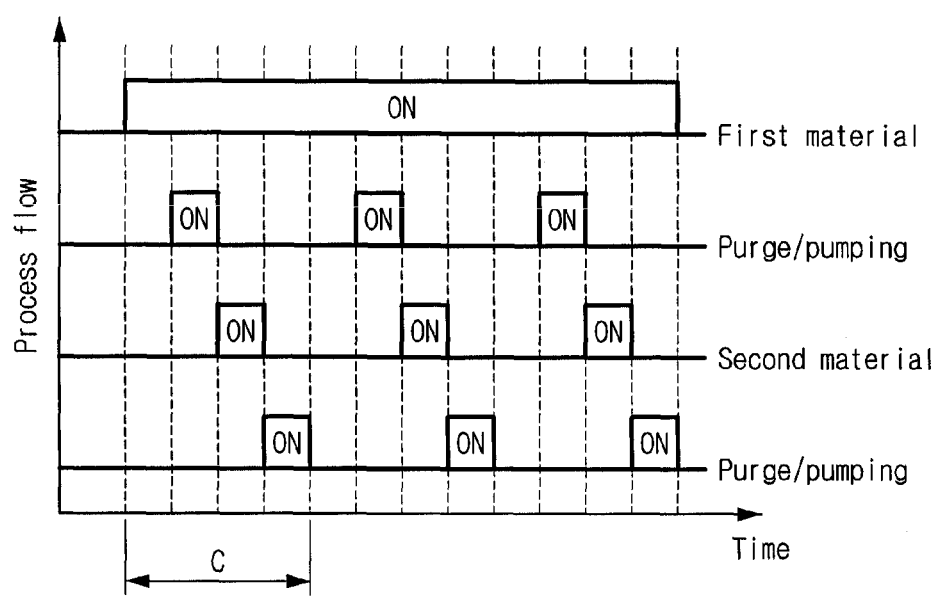
FIG. 12 is a timing diagram of a process for forming a thin film, according to one embodiment.

FIG. 12 is a timing diagram of the method for forming a thin film, according to the embodiment illustrated in FIG. 11. The first material is filled in the chamber. Hence, the first material is continuously maintained in an active state. In the reaction module, three processes of purge/pumping, injection of the second material and purge/pumping are sequentially activated. By repeating cycles C, each consisting of injection of the first material, purge/pumping, injection of the second material and purge/pumping several times, a thin film with a desired thickness can be obtained.

Figure 13:
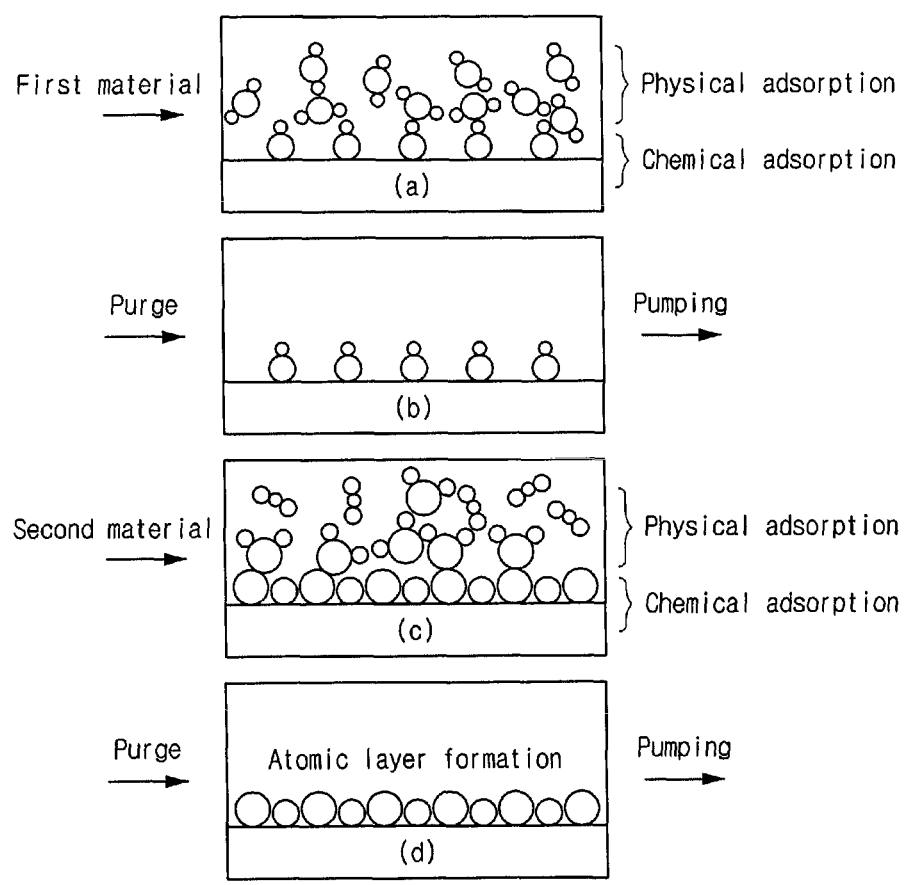
FIG. 13 is a diagram illustrating reaction between materials, according to one embodiment.

FIGS. 13(a) through 13(d) schematically illustrate a reaction between materials, according to the embodiment of FIGS. 11 and 12. Referring to FIG. 13(a), as the first material is injected to the substrate, the physical adsorption layer and/or the chemical adsorption layer of the first material is formed on the substrate. Referring to FIG. 13(b), the physical adsorption layer of the first material is removed by purging and pumping, leaving only the chemical adsorption layer.

Referring to FIG. 13(c), the second material is injected onto the substrate on which the chemical adsorption layer of the first material is formed. Physical and/or chemical adsorption layer of the second material may be formed on the substrate. The chemical absorption layer of the second material forms a thin film by reaction and/or substitution with the chemical adsorption layer of the first material. Referring to FIG. 13(d), the physical adsorption layer of the second material is removed by purging and pumping, and only a single atomic layer remains on the substrate.

In the processes of removing the physical adsorption layers of the first material and the second material described with respect to FIG. 13(b) and FIG. 13(d), respectively, only portions of the physical adsorption layers may be removed. In this case, the residual portions of the physical adsorption layers may remain on the substrate along with the chemical adsorption layers. Hence, the rate of deposition of the thin film may be improved compared to the rate of forming a pure atomic layer thin film.

By using the vapor deposition reactor according to above embodiments, the atomic layer deposition (ALD) process and the mechanical configuration of the related apparatus may be simplified. As a result, a manufacturing cost can be reduced. Further, throughput of the vapor deposition reactor can be improved because more reactors may be installed on the same area (footprint). In addition, a highly reliable apparatus and process can be achieved because undesired diffusion or reaction that may occur as the source precursor is first adsorbed on the surface of the semiconductor substrate or device is minimized Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A method for forming a thin film on a substrate, comprising:
    placing the substrate in a chamber filled with a first material to adsorb the first material on the substrate;
    moving the substrate relative to a reaction module in the chamber; and
    injecting a second material to the substrate as the substrate passes the reaction module, the substrate deposited with a layer of material by reaction of the second material with the first material adsorbed in the substrate or substitution of a portion of the first material adsorbed in the substrate with a portion of the second material.

2. The method according to claim 1, further comprising, prior to injecting the second material, removing a portion of an adsorption layer of the first material adsorbed on the substrate.

3. The method according to claim 2, wherein the removing of the portion of the adsorption layer of the first material comprises:
    injecting a purge gas onto the substrate; and
    pumping, from the chamber, the purge gas and the portion of the adsorption layer of the first material desorbed from the substrate by the purge gas.

4. The method according to claim 3, wherein the purge gas is selected from a group consisting of $N_2$, Ar, He and a combination thereof.

5. The method according to claim 1, further comprising removing a portion of an adsorption layer of the second material adsorbed on the substrate after injecting the second material.

6. The method according to claim 5, wherein removing the portion of an adsorption layer of the second material comprises:
    injecting a purge gas onto the substrate; and
    pumping the purge gas and the portion of the adsorption layer of the second material desorbed from the substrate by the purge gas from the chamber.

7. The method according to claim 6, wherein the purge gas is selected from a group consisting of $N_2$, Ar, He and a combination thereof.

8. The method according to claim 1, wherein moving the substrate relative to the reaction module in the chamber comprises:
    loading the substrate on a support within the chamber; and
    rotating the support loaded with the substrate.

9. The method according to claim 1, further comprising controlling temperature of an interior of the chamber.

10. The method according to claim 1, wherein injecting the second material to the substrate comprises applying plasma, ultrahigh frequency wave or ultraviolet light to the substrate.

11. The method according to claim 1, wherein the first material is selected from a group consisting of $H_2O$, $H_2O_2$, $O_2$, $N_2O$, $O_3$, $O^*$ radical, $NH_3$, $NH_2$—$NH_2$, $N_2$, $N^*$ radical, $CH_4$, $C_2H_6$, $H_2$, $H^*$ radical and a combination thereof.

12. The method according to claim 1, wherein the second material is selected from a group consisting of a group IV compound, a III-V compound, a II-VI compound, a Ni-based compound, a Co-based compound, a Cu-based compound, an Al-based compound, a Ti-based compound, a Hf-based compound, a Zr-based compound, a Ta-based compound, a Mo-based compound, a W-based compound, a Si-based compound, a Zn-based compound, and a combination thereof.

* * * * *